United States Patent [19]
Serfaty et al.

[11] Patent Number: 6,081,702
[45] Date of Patent: Jun. 27, 2000

[54] METHOD AND APPARATUS FOR FREQUENCY CONTROL

[75] Inventors: Salomon Serfaty, Gaash; Eli Ariviv, Hashron; Eliezer Fogel, Herzlya, all of Israel

[73] Assignee: Motorola, Inc., Schaumburg, Ill.

[21] Appl. No.: 08/908,297

[22] Filed: Aug. 7, 1997

[30] Foreign Application Priority Data

Sep. 13, 1996 [GB] United Kingdom .................. 9619207

[51] Int. Cl.⁷ .................................. H04B 7/185
[52] U.S. Cl. ........................... 455/264; 455/255
[58] Field of Search ................. 455/65, 70, 71, 455/68, 192.1, 192.2, 196.1, 255, 257, 258, 259, 264, 67.1; 331/17; 375/344, 326

[56] References Cited

U.S. PATENT DOCUMENTS

| | | |
|---|---|---|
| 4,921,467 | 5/1990 | Lax ......................................... 455/264 |
| 5,115,515 | 5/1992 | Yamamoto et al. ..................... 455/265 |
| 5,170,492 | 12/1992 | Moller et al. ........................... 455/265 |
| 5,574,984 | 11/1996 | Reed et al. ............................. 455/67.1 |
| 5,748,682 | 5/1998 | Mobin .................................... 375/344 |

FOREIGN PATENT DOCUMENTS

| | | | |
|---|---|---|---|
| 0709959 | 10/1995 | European Pat. Off. ........... H03J 7/02 |
| 63-256010 | 10/1988 | Japan ................................ H03J 7/02 |
| WO 96/08882 | 3/1996 | WIPO ............................. H04B 7/185 |

*Primary Examiner*—Reinhard J. Eisenzopf
*Assistant Examiner*—Marsha D. Banks-Harold
*Attorney, Agent, or Firm*—Frank M. Scutch, III

[57] ABSTRACT

The invention concerns a method and apparatus for providing frequency control of an oscillator circuit. The apparatus includes an oscillator (9), an error estimator (10) $f_r$ producing a set of error estimates and a median filter (11) for producing a median value from the set of estimates. The median filter (11) is connected to the oscillator (9) which is responsive to the median value to vary its frequency thereby reducing the error.

4 Claims, 2 Drawing Sheets

METHOD AND APPARATUS FOR FREQUENCY CONTROL

FIELD OF THE INVENTION

This invention relates to apparatus for automatic frequency control for a radio receiver.

BACKGROUND OF THE INVENTION

In communication systems incorporating mobile radio receivers and transmitters (transceivers) a problem occurs because of the Doppler Shift in the perceived frequency of the received signals created by the movement of the receiver. Radio receivers and transmitters utilise local oscillators to provide a reference signal of a particular frequency for modulating or demodulating the transmission signals. Another problem occurs in connection with this in that there will be differences in the frequency of each of the oscillators.

It is known in radio-transmitter and receiver apparatus to provide a circuit which monitors an output of a local oscillator to determine a frequency offset or error. This error is fed back to the local oscillator to correct the frequency. Such circuits are commonly known as automatic frequency control (AFC) circuits. Another cause of frequency deviation in the transmitted signal is Rayleigh fading. This causes large nearly instantaneous or momentary deviations in the perceived frequency error.

SUMMARY OF THE INVENTION

According to a first aspect of the invention there is provided a method of reducing a frequency error in a signal provided by a local oscillator comprising the steps of: determining a set of frequency shift estimates; determining a median value of the set of frequency shift estimates and controlling the local oscillator with reference to the median value to vary the frequency of the signal to reduce the frequency error.

By determining a median value of the frequency shift estimates, extreme error estimates due to Rayleigh fading are eliminated and a more appropriate error estimate utilised for controlling the local oscillator. Thus, the output signal of the oscillator is much more accurately obtained.

The time required to produce the median value will be determined by the size of the set of frequency shift estimates. However, the larger the set the greater in the accuracy of the median error estimate. Advantageously, the number of shift estimates is varied. This will enable there to be a compromise be reached between speed and accuracy. Preferably, the variation is such that the size of the set increases. This is preferable because it allows a rapid, if relatively less accurate correction, to be made at initialisation followed by more accurate corrections, if relatively slower.

BRIEF DESCRIPTION OF THE DRAWINGS

Specific embodiments of the invention will now be described by way of example only with reference to the drawings in which.

DETAILED DESCRIPTION

Figure 1:
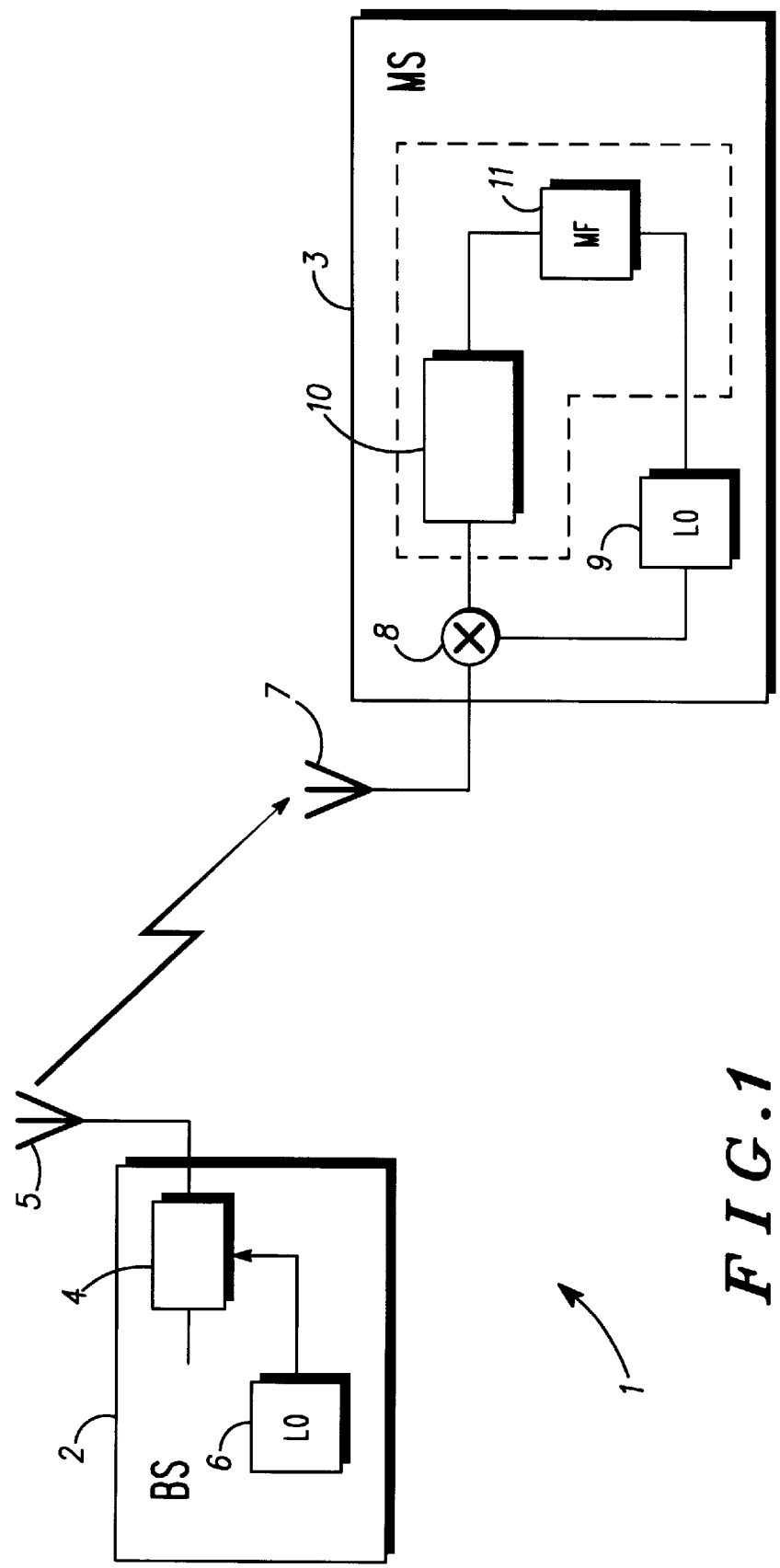
FIG. 1 shows in schematic block diagram form a radio system including a mobile transceiver in accordance with the invention.

With reference to FIG. 1, there is shown a communication system 1 comprising a base-station (BS) 2 and a mobile (MS) 3. Only those parts of the base-station 2 and mobile 3 that are necessary for an understanding of the invention will be described in detail. The base-station 2 includes a transmitter unit 4 coupled to an antenna 5 and a local oscillator 6 providing a reference signal for the transmitter unit 4. (The base-station 2 also has a processor controlling its operation and a receiver unit but these are not shown.) Mobile 3 includes an antenna 7, a frequency mixer 8, a local oscillator 9, an error estimator 10 and a median filter 11. The antenna 7 is connected to the mixer 8 and the mixer 8 has an output connected to the error estimator 10. The error estimator 10 is connected to the median filter 11 and in turn the median filter 11 is connected to the mixer 8. In this particular embodiment, the error estimator 10 and the median filter 11 are both implemented on a digital signal processor (DSP) represented in the diagram by the broken outline. Thus, FIG. 1 shows a combination of functional logic blocks and physical circuit blocks.

Communications transmitted from the base-station 2 are transmitted at the frequency of the local oscillator 6. This is an oscillator having a very accurately maintained frequency $f_t$ which can be considered to be the true transmission frequency. In order to accurately decode the communications it is necessary for the local oscillator 9 of the mobile station to provide a frequency which is as close as possible to $f_t$. This is the purpose of the error estimator 10 and the median filter 11.

The communications are received by the antenna 7 of the mobile 3 and the carrier signal is removed by mixing the signal of the local oscillator 9 at the mixer 8. The output from the mixer 8 is analysed by the DSP and in particular the error estimator 10 estimates the error in the communication signal that is present. This error will be due to the difference in $f_t$ and the reference signal $f_r$ provided by the local oscillator but will also include error due to interference or Rayleigh fading.

The error due to the interference and or Rayleigh fading may, because it may be a larger error than that due to $f_r$ tend if used to correct the local oscillator 9 create an even greater mixmatch between $f_t$ and $f_r$. The error estimator 10 produces a digital output in the form of a stream of binary numbers each number representing the perceived estimated error between $f_t$ and $f_r$. For convenience the following exemplary number streams are given in decimal.

| example 1 | 1 | 2 | 3 | | |
| example 2 | 1 | 2 | 100 | | |
| example 3 | 1 | 2 | 3 | | |
| example 4 | 1 | 2 | 3 | 4 | 5 |
| example 4 | 1 | 2 | 5 | -4 | 9 |

Figure 2:
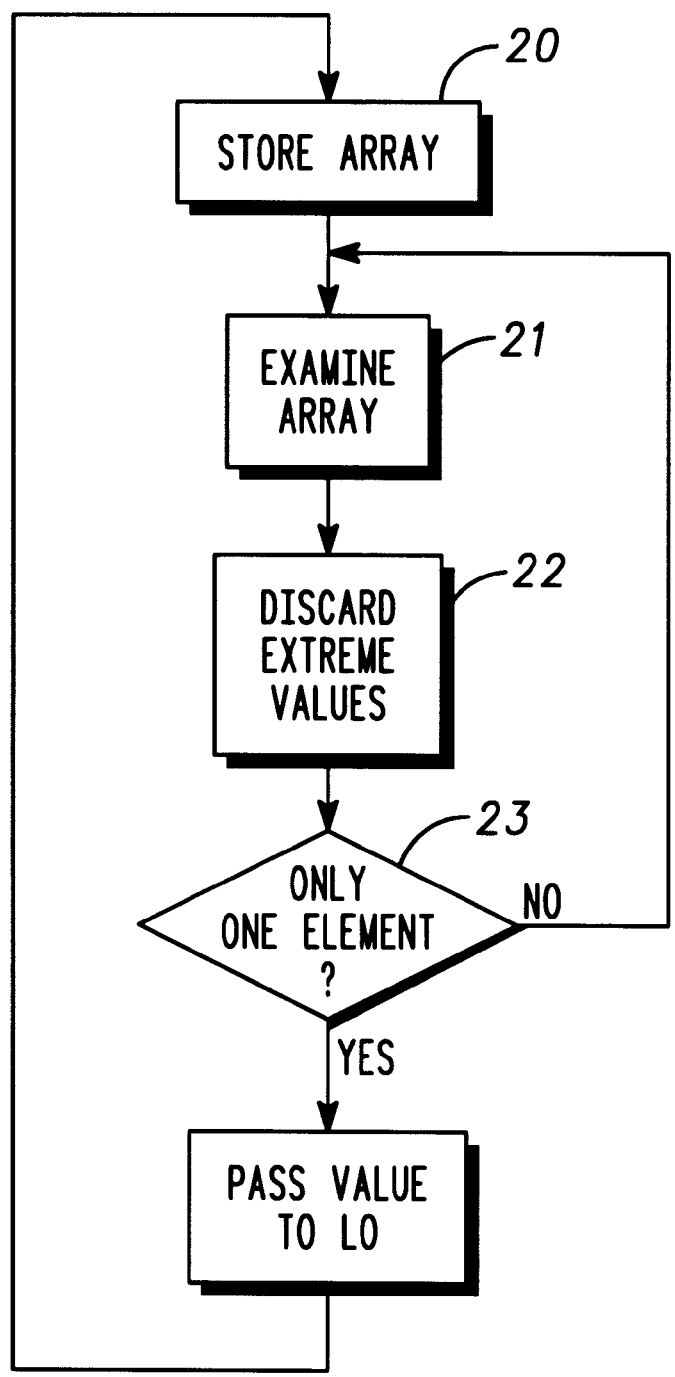
FIG. 2 is an explanatory flow chart.

The median filter 11 processes the number streams in the following manner as is illustrated in FIG. 2. The number streams are stored as an array in step 20 and each element of the array is examined in step 21. The extreme values, that is to say, the lowest and highest values are discarded in step 22. Consideration is then given in step 23 as to whether or not there is only one element left in the array. If there is more than two elements in the array then the process returns to step 21 and the array is examined again and the discard step 22 carried out again for the highest and lowest values. Consideration is given again in step 23 as to whether or not there is only one element left in the array.

Steps 21, 22 and 23 are repeated until only one element remains. This element will hold the median value of the number stream. The next step when there is only one remaining element is for the value to be passed to the local oscillator 9. The local oscillator 9 then varies its frequency accordingly to reduce this error. Thus for example 1, numbers 1 and 3 will be discarded because they are the extreme values. Number 2 remains and this is the median value passed to local oscillator 9. For example 2, numbers 1 and 100 are discarded because they are the extreme values and number 2 remains. This median value will be passed to local oscillator 9. For example 3, in a first pass the numbers 1 and 5 will be discarded. This leaves an array 2 3 4. Because there is more than one remaining array element (in this case three elements) another pass is required. In the second pass the numbers 2 and 4 are discarded and then the remaining number 3 is passed to the local oscillator 9. In example 4, in a first pass numbers −4 and 9 are discarded. This leaves an array 1 2 5. In the next pass numbers 1 and 5 are eliminated and then the remaining number 2 passed to the local oscillator 9. It will now be appreciated that the larger the array of numbers the greater is the processing time required before a correcting median value can be passed to the local oscillator 9.

In a preferred embodiment of the invention the array size is varied in the following manner. Upon initialisation of the mobile 3 it selects a relatively small array of numbers. This means that within a relatively short period of time the local oscillator 9 is relatively roughly corrected. After this initial correction the size of the array for the derivation of subsequent medians is increased providing more accurate correcting median values although at a less frequent interval.

What is claimed is:

1. A method of reducing a frequency error in a signal provided by a local oscillator comprising the steps of determining a set of frequency shift estimates; determining a median value of the set of frequency shift estimates; and controlling the local oscillator with reference to the median value to vary the frequency of the signal to reduce the frequency error and varying the number of frequency shift estimates from which the set is formed prior to determining a further median value of the set.

2. A method as claimed in claim 1 wherein the variation in the number of shift estimates in the set is such that the size of the set is increased.

3. An oscillator circuit for producing an output of a desired frequency comprising an oscillator having an output signal an error estimator for producing a set of values indicative of the frequency error between the output signal and the desired frequency; a median filter for determining a median value of the set of values and an oscillator controller responsive to the median value provided by the median filter to vary the output signal of the oscillator to reduce the error.

4. A circuit as claimed in claim 3 further including a set size definer for varying the size of the set of values.

* * * * *